US011327409B2

(12) United States Patent
Roy et al.

(10) Patent No.: US 11,327,409 B2
(45) Date of Patent: May 10, 2022

(54) SYSTEMS AND METHODS FOR CURING AN IMPRINTED FIELD

(71) Applicant: CANON KABUSHIKI KAISHA, Tokyo (JP)

(72) Inventors: Nilabh K. Roy, Austin, TX (US); Anshuman Cherala, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/661,281

(22) Filed: Oct. 23, 2019

(65) Prior Publication Data
US 2021/0124274 A1  Apr. 29, 2021

(51) Int. Cl.
*G03F 7/20* (2006.01)

(52) U.S. Cl.
CPC ........ *G03F 7/70558* (2013.01); *G03F 7/7035* (2013.01)

(58) Field of Classification Search
CPC .......................... G03F 7/7035; G03F 7/70558
See application file for complete search history.

(56) References Cited

U.S. PATENT DOCUMENTS

| | | |
|---|---|---|
| 5,296,891 A | 3/1994 | Vogt et al. |
| 5,523,193 A | 6/1996 | Nelson |
| 6,936,194 B2 | 8/2005 | Watts |
| 7,157,036 B2 | 1/2007 | Choi et al. |
| 8,066,930 B2 | 11/2011 | Sreenivasan et al. |
| 8,076,386 B2 | 12/2011 | Xu et al. |
| 8,349,241 B2 | 1/2013 | Sreenivasan et al. |
| 9,971,249 B1* | 5/2018 | Barnesberger ........ G03F 7/2047 |
| 10,191,384 B2 | 1/2019 | Liu et al. |
| 2007/0031744 A1 | 2/2007 | Crouse et al. |
| 2007/0258137 A1* | 11/2007 | Kamijima .............. G02B 5/045 |
| | | 359/431 |

(Continued)

FOREIGN PATENT DOCUMENTS

| | | |
|---|---|---|
| JP | 2017-147284 A | 8/2017 |
| JP | 2019-067918 A | 4/2019 |

(Continued)

OTHER PUBLICATIONS

Andrew J. Fleming, Adrian G. Wills, Ben S. Routley, Exposure Optimization in Scanning Laser Lithography, IEEE Potentials Jul. 20, 2016, 35(4):33-39, IEEE, Piscataway, NJ, 2016.

(Continued)

*Primary Examiner* — Michelle M Iacoletti
(74) *Attorney, Agent, or Firm* — Daniel Ratoff

(57) ABSTRACT

Methods and systems that include the generation of a map of modulation values for a spatial light modulator. In which a map representative of a desired curing region is received. Receiving, for each pixel of a spatial light modulator, spatial information representative of an intensity distribution of actinic radiation at a plane of formable material under a template that is guided from the spatial light modulator to the plane of the formable material for curing the formable material under the template. Receiving a dose threshold for the formable material. Generating a map of modulation values for each pixel in the spatial light modulator based on: the dose threshold; the spatial information for all of the pixels; and the map representative of the desired curing region.

18 Claims, 11 Drawing Sheets

(56) References Cited

U.S. PATENT DOCUMENTS

| | | |
|---|---|---|
| 2008/0243730 A1 | 10/2008 | Bischoff et al. |
| 2009/0200710 A1 | 8/2009 | Khusnatdinov et al. |
| 2010/0315614 A1 | 12/2010 | Hansen |
| 2013/0078820 A1 | 3/2013 | Mikami |
| 2013/0078821 A1 | 3/2013 | Furutono |
| 2015/0118847 A1 | 4/2015 | Mikami |
| 2016/0025992 A1* | 1/2016 | Van Der Zouw .. G01N 21/8806 250/216 |
| 2016/0033877 A1 | 2/2016 | Smilde et al. |
| 2017/0217054 A1 | 8/2017 | Murasato |
| 2018/0314163 A1 | 11/2018 | Liu |
| 2019/0179228 A1 | 6/2019 | Khusnatdinov et al. |

FOREIGN PATENT DOCUMENTS

| | | |
|---|---|---|
| JP | 2019-075551 A | 5/2019 |
| JP | 2019-080047 A | 5/2019 |
| WO | 2018/153866 A1 | 8/2018 |
| WO | 2019/065250 A1 | 4/2019 |
| WO | 2019/078060 A1 | 4/2019 |

OTHER PUBLICATIONS

Chi Zhou, Yong Chen, Additive Manufacturing Based on Optimized Mask Video Projection for Improved Accuracy and Resolution, Journal of Manufacturing Processes, Apr. 2012, 14(2):107-118, Elsevier B.V., Amsterdam NL, 2012.

* cited by examiner

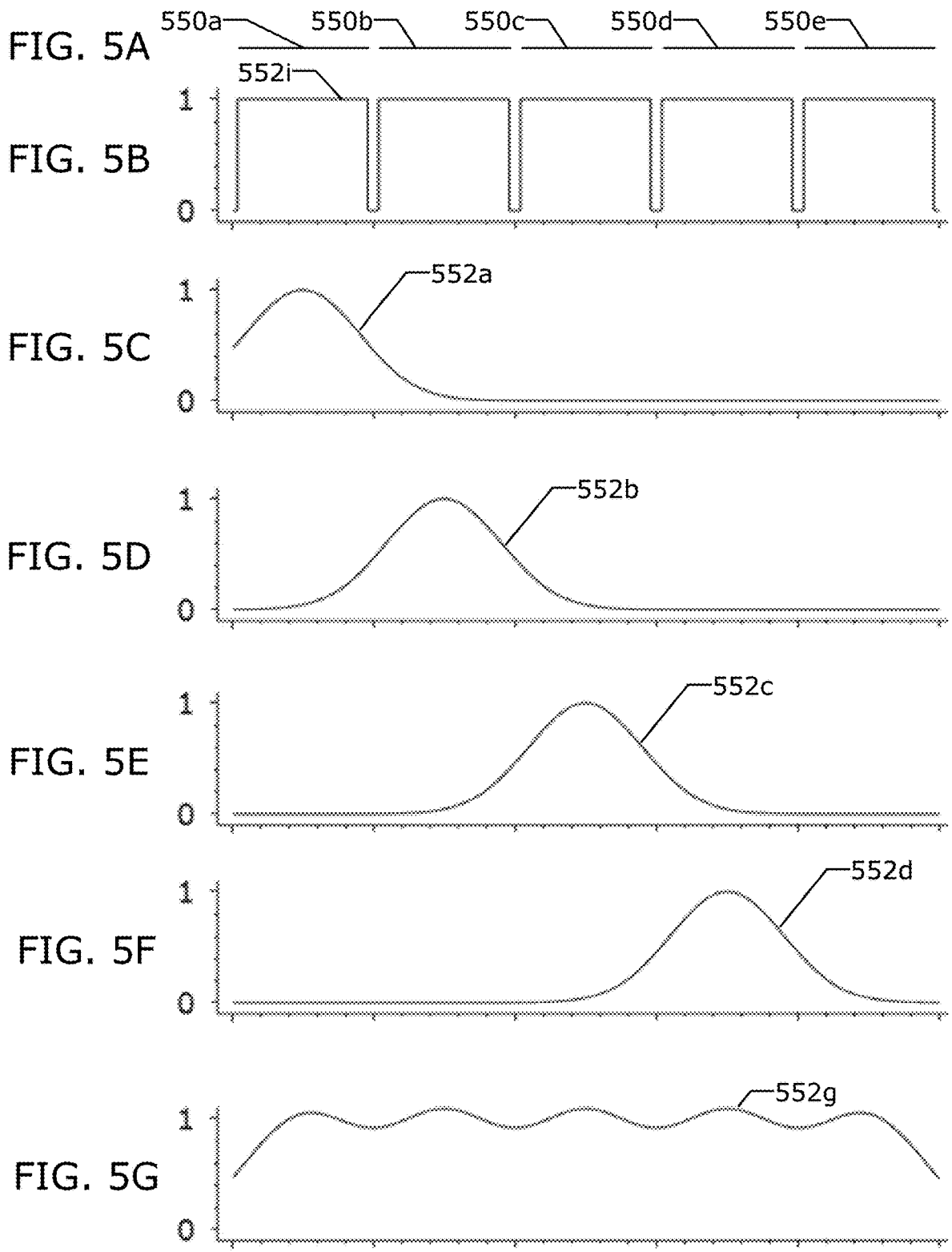

SYSTEMS AND METHODS FOR CURING AN IMPRINTED FIELD

BACKGROUND OF INVENTION

Technical Field

The present disclosure relates to systems and methods for curing an imprinted film.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY OF THE INVENTION

A first embodiment, may be a method. The method may comprise receiving a map representative of a desired curing region. The method may further comprise receiving, for each pixel of a spatial light modulator, spatial information representative of an intensity distribution of actinic radiation at a plane of formable material under a template that is guided from the spatial light modulator to the plane of the formable material for curing the formable material under the template. The method may further comprise receiving a dose threshold for the formable material. The method may further comprise generating a map of modulation values for each pixel in the spatial light modulator based on: the dose threshold; the spatial information for all of the pixels; and the map representative of the desired curing region.

The first embodiment, may further comprise sending a first set of signals to the spatial light modulator based on the map of modulation values. The method may further comprise illuminating the spatial light modulator with actinic radiation. The spatial light modulator may illuminate a first portion of the formable material under the template to a first actinic radiant dosage pattern in accordance with the map of modulation values producing a first cured film. The method may further comprise measuring a first set of defects in the first cured film, including both extrusion defects and non-fill defects. The method may further comprise generating a second map of modulation values based on the first set of defects. The method may further comprise sending a second set of signals to the spatial light modulator based on the second map of modulation values. The spatial light modulator may illuminate a second portion of the formable material under the template to a second actinic radiant dosage pattern in accordance with the second map of modulation values producing a second cured film.

In an aspect of the first embodiment, the spatial light modulator may produce the second actinic radiant dosage pattern by changing duty cycles of pixels of the spatial light modulator in accordance with the second map of modulation values.

In an aspect of the first embodiment, the spatial light modulator includes a digital micromirror device; and changing the duty cycle of an individual pixel of the spatial light modulator may include adjusting a period of time during which an individual mirror on the digital micromirror device guides actinic radiation towards the formable material under the template.

The first embodiment, may further comprise measuring a second set of defects in the second cured films. The second set of defects may be less than the first set of defects.

In an aspect of the first embodiment, the spatial light modulator includes a transmissive spatial intensity modulator. The spatial light modulator may produce the second actinic radiant dosage pattern by changing transmissivity of pixels of the transmissive spatial intensity modulator in accordance with the second map of modulation values.

In an aspect of the first embodiment, the transmissive spatial intensity modulator may include: a liquid crystal polarization retarder; and a polarizer.

In an aspect of the first embodiment, the spatial light modulator may include a reflective spatial intensity modulator. The spatial light modulator may produce the second actinic radiant dosage pattern by changing reflectivity of pixels of the reflective spatial intensity modulator in accordance with the second map of modulation values.

In an aspect of the first embodiment, the reflective spatial intensity modulator may include: a liquid crystal polarization retarder on silicon with a reflective coating; and a polarizer.

In an aspect of the first embodiment, the spatial light modulator may produce the first actinic radiant dosage pattern by changing duty cycles of pixels of the spatial light modulator in accordance with the map of modulation values.

In an aspect of the first embodiment, the method may also be used for manufacturing articles. The method may further comprise processing a substrate on which the second cured film is produced so as to manufacture the articles.

In an aspect of the first embodiment, the first actinic radiant dosage pattern may have an outer boundary that is defined by a mesa edge of the template.

The first embodiment, may further comprise receiving spatial information representative of a second distribution of actinic radiant dosage at the plane of the formable material under the template produced that has not been guided by the spatial light modulator to the plane of the formable material. Generating the map of modulation values may also be based on the second distribution of actinic radiant dosage In an aspect of the first embodiment, for each pixel of the spatial light modulator, the spatial information may include a peak position in the plane of the formable material under the template of a peak of the intensity distribution of the actinic radiation at the plane of formable material under the template that is guided from the spatial light modulator to the plane of the formable material for curing the formable material under the template.

In an aspect of the first embodiment, the peak position for each pixel includes an offset vector representative of a deviation from a measured position of peak intensity and an expected position of peak intensity.

The first embodiment, may further comprise receiving template spatial information representative of an outer boundary of a patterning surface of the template. The method may further comprise generating the map representative of the desired curing region based on the template spatial information.

The first embodiment, may further comprise receiving a preliminary map representative of the desired curing region. The method may further comprise receiving experimental data representative of a measured cured region based on the preliminary map. The method may further comprise determining fitting parameters of a model function between the desired curing region and the measured cured region. The method may further comprise generating the map representative of the desired curing region based on an inverse model function and the fitting parameters.

A second embodiment, may be a system comprising: a memory; and a processor. The processor may be configured to receive a map representative of a desired curing region. The processor may be configured to receive, for each pixel of a spatial light modulator, spatial information representative of an intensity distribution of actinic radiation at a plane of formable material under a template that is guided from the spatial light modulator to the plane of the formable material for curing the formable material under the template. The processor may be configured to receive a dose threshold for the formable material. The processor may be configured to generate a map of modulation values for each pixel in the spatial light modulator based on: the dose threshold; the spatial information for all of the pixels; and the map representative of the desired curing region.

The second embodiment, may further comprise a nanoimprint lithography system. The nanoimprint lithography system may include: the spatial light modulator; a source of actinic radiation configured to illuminate spatial light modulator; and a template chuck configured to hold the template. The processor may be configured to send a first set of signals to the spatial light modulator based on the map of modulation values. The spatial light modulator may illuminate a first portion of the formable material under the template to a first actinic radiant dosage pattern in accordance with the map of modulation values producing a first cured film. The processor may be configured to receive defect measurements of a first set of defects in the first cured film, including both extrusion defects and non-fill defects. The processor may be configured to generate a second map of modulation values based on the first set of defects. The processor may be configured to send a second set of signals to the spatial light modulator based on the second map of modulation values. The spatial light modulator may illuminate a second portion of the formable material under the template to a second actinic radiant dosage pattern in accordance with the second map of modulation values producing a second cured film.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIG. 5A is an illustration of a set of pixels in a spatial light modulator as might be used in an embodiment.

FIGS. 5B-G are illustrations of actinic radiation patterns as used in embodiments.

Figure 1:
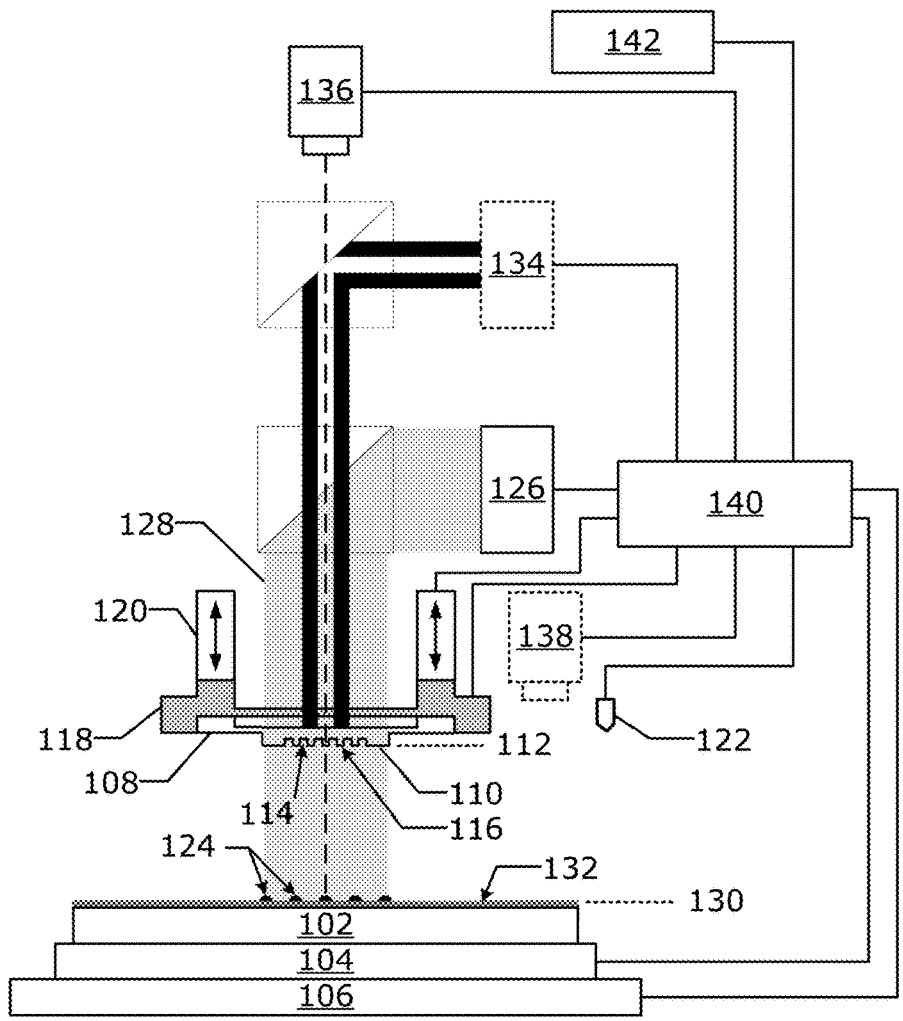
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

The nanoimprinting lithography technique can be used to shape a film on a substrate from a formable material. The shaping process includes bringing a template into contact with the formable material. The template includes a shaping surface on a mesa that extends above a recessed surface. The template also includes mesa sidewalls that surround the mesa and connect the mesa to the recessed surface. During the shaping process the formable material spreads due to capillary action and other forces such that the formable material spreads toward the mesa sidewalls. Extrusion defects form when formable material wets the mesa sidewalls during the shaping process. After the formable material is exposed to actinic radiation, and the template separates from the formable material, one or more extrusion defects may stay on the substrate and/or template. Non-fill defects form when the formable material does not reach the edge of the mesa or does not fill features within the template. The applicant has found that depending on the size tolerance (from a few 100 nm-tens of µm) for extrusion defects and non-fill defects these defects do not always occur in a repeatable manner (for very small defects) but have a stochastic component. The applicant has found that it is advantageous to minimize the occurrence of both extrusions and non-fill defects to improve the yield of the manufacturing process.

The applicant has found that it is possible to reduce the occurrence of these defects if the intensity of the actinic radiation in the regions of these defects is carefully controlled. These defects tend to occur near the mesa sidewalls. The applicant has found that it is helpful to use a frame curing process to cure and/or help cure the areas near the mesa sidewall with a carefully controlled dosage of actinic radiation. The frame curing process may make use of a spatial light modulator that has a limited number of pixels and has less than 100% fill factor.

Specific constraints of the specific spatial light modulator and specific optical system used in the frame curing process places limitations on the adjustability of the distribution of actinic radiation at the imprint plane. What is needed is a means for overcoming these constraints and minimize the occurrence of both extrusion defects and non-fill defects.
Nanoimprint System (Shaping System)

FIG. 1 is an illustration of a nanoimprint lithography system 100 in which an embodiment may be implemented. The nanoimprint lithography system 100 is used to produce an imprinted (shaped) film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. The patterning surface 112, also known as a shaping surface, is the surface of the template that shapes the formable material 124. In an embodiment, the patterning surface 112 is planar and is used to planarize the formable material. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head 120 may include one or more actuators such as voice coil motors, piezoelectric motors, linear motor, nut and screw motor, etc., which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a curing system that includes at least a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108; the separation of the template 108 from cured formable material; and can be used to keep track of the imprinting process. The field camera 136 may also be configured to measure interference fringes, which change as the formable material spreads 124 between the gap between the patterning surface 112 and the substrate surface 130.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatio-temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has contacted the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system 36 may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124, forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form a planar layer with a featureless patterning surface 112.

The imprinting process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template

Figure 2:
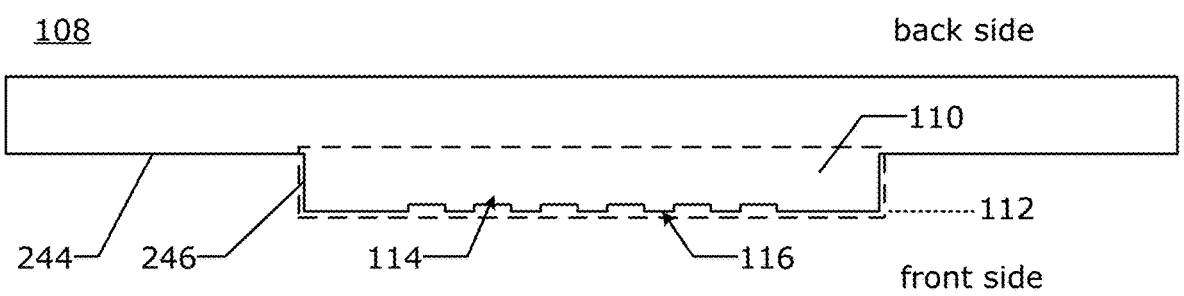
FIG. 2 is an illustration of an exemplary template that may be used in an embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls 246 refers to a single mesa sidewall that is a continuous wall without corners.

Imprinting Process

Figure 3:
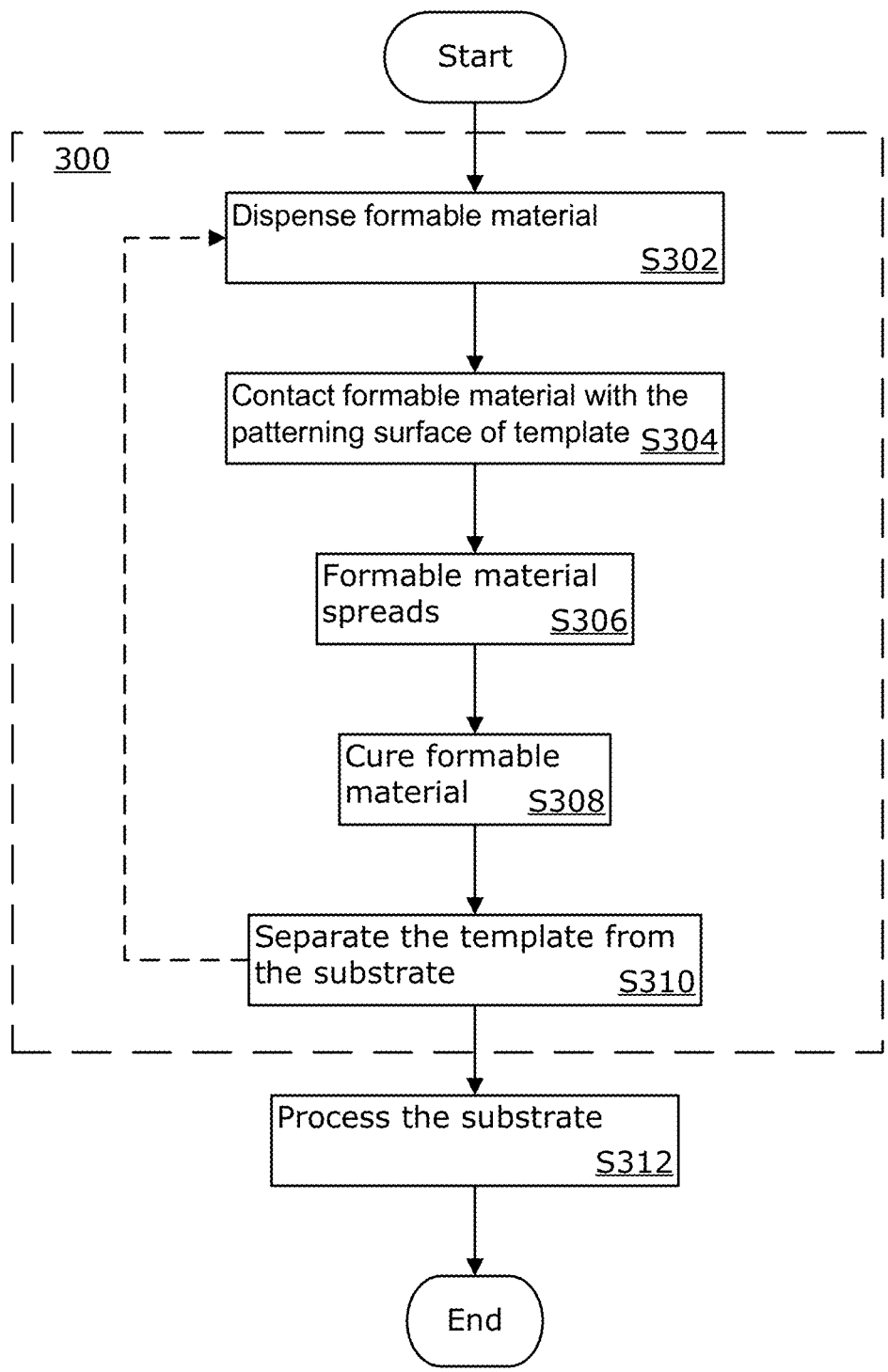
FIG. 3 is a flowchart illustrating an exemplary imprinting method as used in an embodiment.

FIG. 3 is a flowchart of a method of manufacturing an article (device) that includes an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control the imprinting process 300.

In an alternative embodiment, the imprinting process 300 is used to planarize the substrate 102. In which case, the patterning surface 112 is featureless and may also be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by an index i. In which N is a real integer such as 1, 10, 75, etc. $\{N \in \mathbb{Z}^+\}$. In a dispensing step S302, the processor 140 may cause the fluid dispenser 122 to dispense formable material onto an imprinting field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102. If there are additional imprint fields to be imprinted, then the process moves back to step S302.

In an embodiment, after the imprinting process 300 is finished additional semiconductor manufacturing processing is performed on the substrate 102 in a processing step S312 so as to create an article of manufacture (e.g. semiconductor device). In an embodiment, each imprint field includes a plurality of devices.

The further semiconductor manufacturing processing in processing step S312 may include etching processes to transfer a relief image into the substrate that corresponds to the pattern in the patterned layer or an inverse of that pattern. The further processing in processing step S312 may also include known steps and processes for article fabrication, including, for example, inspection, curing, oxidation, layer formation, deposition, doping, planarization, etching, formable material removal, dicing, bonding, packaging, and the like. The substrate 102 may be processed to produce a plurality of articles (devices).

Imprinting System with a Spatial Light Modulator

Figure 4A:
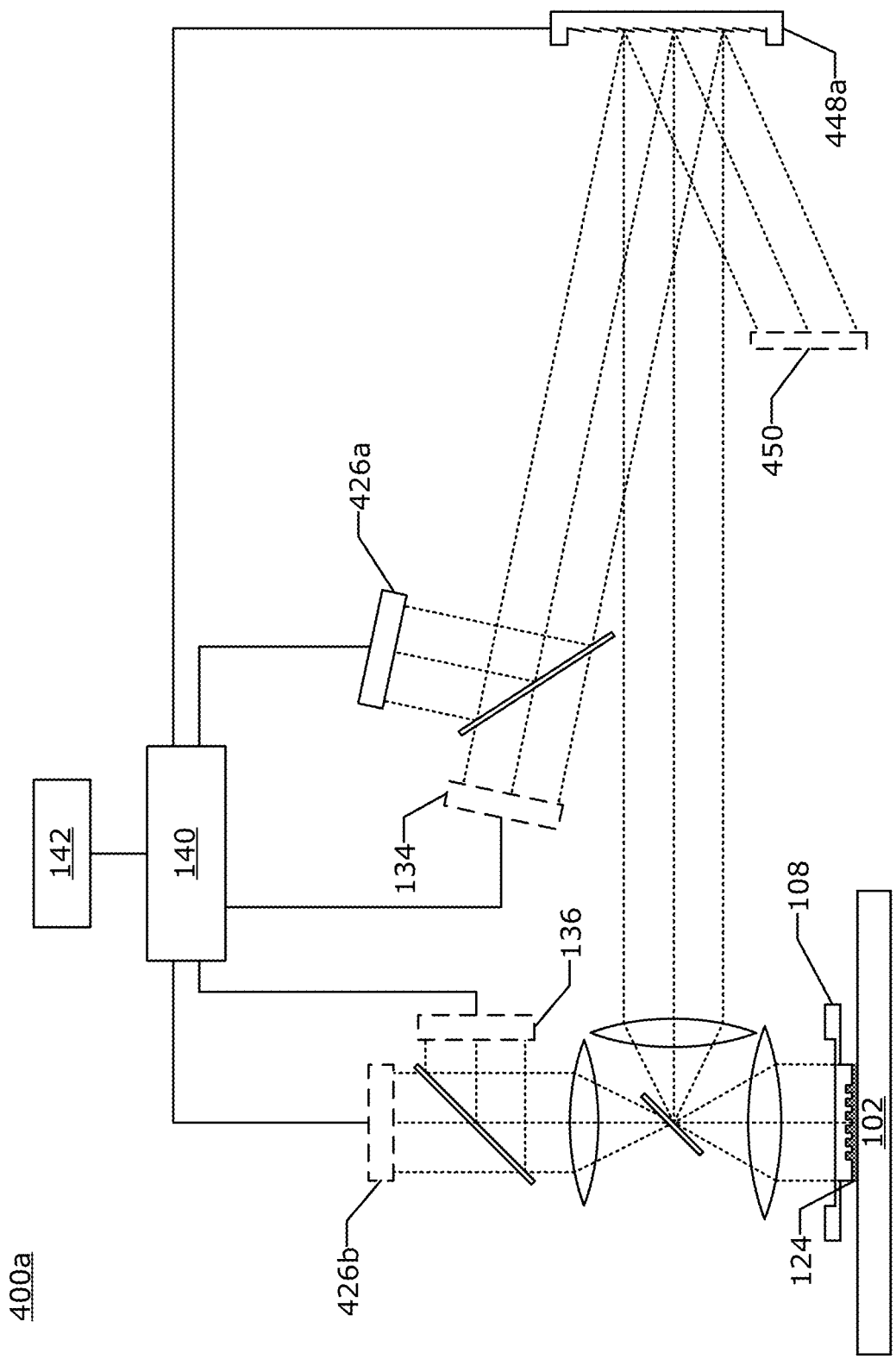
FIGS. 4A-C are illustrations of particular components of an exemplary imprinting method as used in embodiments.

FIG. 4A is an illustration of a nanoimprint lithography system 400a that is substantially similar to the nanoimprint lithography system 100 illustrated in FIG. 1 in which a spatial light modulator 448 is explicitly shown. The order, arrangement, and use of optical components such as light sources, beam splitters, lenses, and mirrors as illustrated in FIG. 4A are exemplary and other arrangements of optical components can be used to carry out an embodiment.

The nanoimprint lithography system 400a may include a first source of actinic radiation 426a. The first source of actinic radiation 426a may be a laser, LED, or a lamp. The first source of actinic radiation 426a is positioned to illuminate the spatial light modulator 448. One or more optical components may be arranged to guide the actinic radiation to the spatial light modulator. The first source of actinic radiation 426a may receive one or more signals from the processor 140 with instruction on when and how much actinic radiation to provide.

The spatial light modulator 448 may be a digital micromirror device (DMD), Liquid Crystal on Silicon (LCoS), Liquid Crystal Device (LCD), spatial light valve, mirror array, MOEMS, diffractive MEMS, etc., to modulate the spatio-temporal distribution of actinic radiation from the first actinic radiation source 426a. The spatial light modulator may also be configured to irradiate one or more of the substrate 102, the template 108, and/or the formable material 124 with radiation from a thermal radiation source 134.

The spatial light modulator 448 may include a plurality of pixels tessellated across the spatial light modulator 448. Each pixel may be individually addressable in both space and time. The processor 140 may be configured to send a first set of signals to the spatial light modulator 448 based on a map of modulation values received from the memory 142. In response to the first set of signals the spatial light modulator 448 will change the state of individual pixels in the spatial light modulator. In an embodiment, the map is information indicating on/off status of each pixel of the spatial light modulator 448 (DMD, LCD). In an embodiment, the map is information indicating the status of each pixel of the spatial light modulator 448 (DMD, LCD). In which the status includes one or more of: on/off status; on/off status duration; amount reflected (for reflective LCD); amount transmitted (for transmitted LCD).

In the case in which the spatial light modulator is a DMD changing the state of a pixel means moving a micromirror from a first angle to a second angle. In the case in which the spatial light modulator 448 is a transmissive spatial light modulator, such as an LCD or a spatial light valve, changing the state of a pixel means changing the transmissivity of the pixel. Changing the transmissivity may include changing the state of a polarization retarder (for example a liquid crystal). The polarization retarder may include or be optically coupled to a polarizer which block some portion of the light. In the case in which the spatial light modulator 448 is a reflective spatial light modulator, such as an LCoS, changing the state of a pixel means changing the reflectivity of the pixel. Changing the transmissivity may include changing the state of a polarization retarder (for example a liquid crystal) on a reflective surface. The polarization retarder may include or be optically coupled to a polarizer which blocks some portion of the light.

FIG. 4A is an illustration of an embodiment 400a in which the spatial light modulator is a DMD. Individual mirrors (pixels) on the spatial light modulator may be in a first state that guides the actinic radiation towards the template or in a second state that guides the actinic radiation away from the template for example towards a beam dump 450.

Figure 4B:
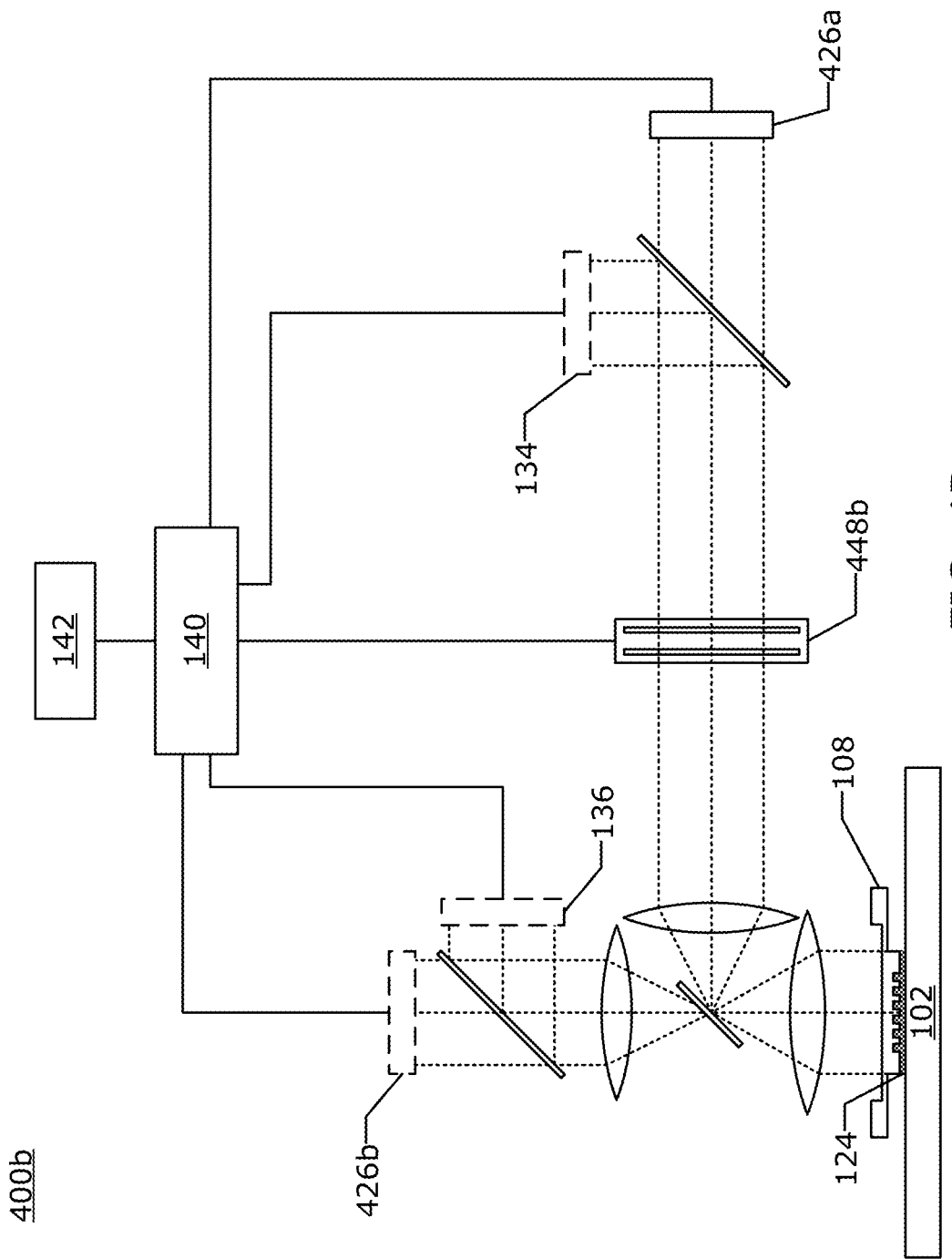

FIG. 4B is an illustration of an embodiment 400a in which the spatial light modulator is a transmissive spatial light modulator 448b such as an LCD. The transmissive spatial light modulator 448b may include a spatio-temporally addressable liquid crystal polarization retarder and a polarizer. The transmissive spatial light modulator 448b may include MEMS based spatio-temporally addressable light valves.

Figure 4C:
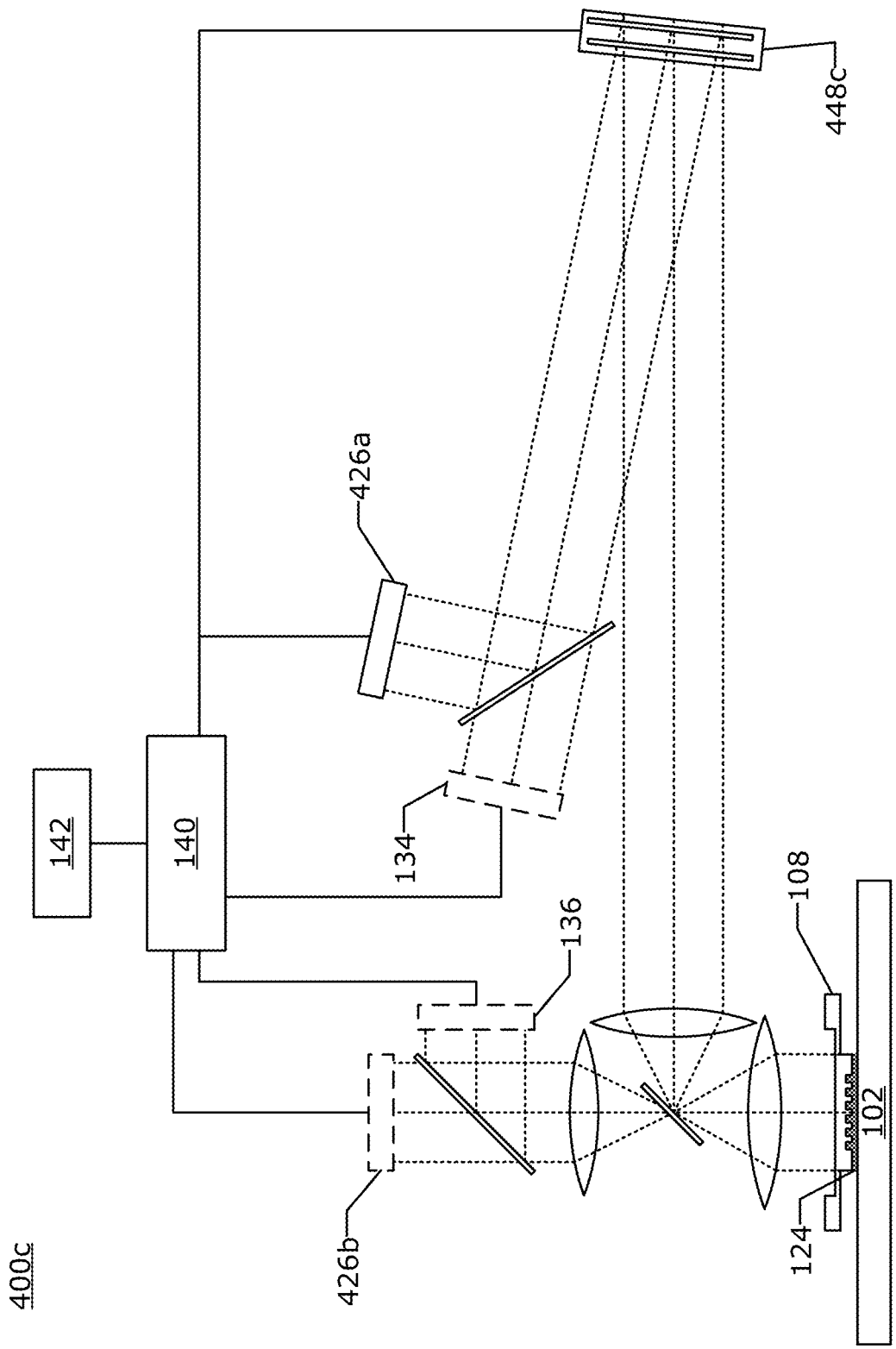

FIG. 4C is an illustration of an embodiment 400a in which the spatial light modulator is a reflective spatial intensity modulator 448c such as a LCoS device. The reflective spatial light modulator 448c may include a spatio-temporally addressable liquid crystal polarization retarder, a polarizer, and a reflective surface such as silicon. The reflective spatial intensity modulator 448c may include a MEMS based spatio-temporally addressable reflective surface.

The spatial light modulator 448 is positioned to illuminate the formable material 124 under the template 108 with actinic radiant (also referred to herein as actinic radiation) spatio-temporal distribution of energy ($J/m^2$) in accordance with signals received from the processor 140 which are representative of a map of modulation values (for e.g. intensity & duty cycles). The actinic radiation cures or helps cure the formable material 124 under the template 108. An embodiment may include one or more optical components such as lenses, mirror, apertures, etc. which guide the radiation from the spatial light modulator 448 to the formable material 124. An embodiment may include one or more optical components which help match the shape of the active area of the spatial light modulator 448 to the shape of the mesa 110. An embodiment may include one or more optical components which adjust the position of the focal plane of the actinic radiation from the spatial light modulator relative to formable material 124.

An embodiment, may include a second source of actinic radiation source 426b which has not been guided by the spatial light modulator the plane of the formable material 124. Actinic radiation from the second source actinic radiation source 426b is guided by one or more other optical components to the formable material 124. The second source of actinic radiation source 426b may have the same or different wavelength from the first actinic radiation source 426a. An embodiment may include one or more beam combiners (such as prisms, half silvered mirrors, dichroic filters, etc.) which combine light from the spatial light modulator 448 and the second source of actinic radiation 426b. In an embodiment, actinic radiation from each of the radiation sources may be directed at the formable material 124 from a different angle.

In an embodiment, the second source of actinic radiation 426b is configured to illuminate a central portion of the patterning surface 112 and the first source of actinic radiation 426a is configured illuminate the outer edges of the patterning surface 112 near the mesa sidewalls 246.

An embodiment, may include a field camera 136 which monitors the formable material under the template 108 and may control the timing of the illumination of the formable material 124 with actinic radiation.

In an embodiment, the fill factor of the spatial light modulator 448 is less than 100%. The fill factor varies depending on the technologies, from a high of 94% (or potentially more in the future) down to less than 1% depending on the modulation technology. Artifacts can be formed in the cured formable material due to the less than 100% fill factor. The applicant has found that, the impact of these artifacts can be limited by defocusing the actinic radiation at the plane of the formable material. A consequence of this defocusing is that the pixels of the spatial modulator do not produce an image that exactly reflects the shape of the pixels in the spatial light modulator. Instead the tail ends of all the pixels overlap each other. What is needed is a way to determine a map of modulation values that takes this situation into account and also takes into account the binary nature (cured/not cured) of the cured formable material.

FIG. 5A is an illustration of the active areas of 5 exemplary pixels (550a, 550b, 550c, 550d, and 550e) in a spatial light modulator with a 92% fill factor. FIG. 5B illustrates a cross section of an idealized actinic radiant intensity pattern 552i at the formable material 124 under the template 108, in the case where the five pixels 550a-e are turned on and focused at the plane of the formable material. In the present context, radiant intensity is equivalent to irradiance flux density ($W/m^2$). FIGS. 5C-G are illustrations of cross sections of actinic radiant intensity patterns 552a-g at the plane of the formable material in which the pixels are not focused at the plane of the formable material. FIG. 5C is actinic radiant intensity pattern 552a due to only pixel 550a being on. FIG. 5D is actinic radiant intensity pattern 552b due to only pixel 550b being on. FIG. 5E is actinic radiant intensity pattern 552c due to only pixel 550c being on. FIG. 5F is actinic radiant intensity pattern 552d due to only pixel 550d being on. FIG. 5G is actinic radiant intensity pattern 552g due to pixels 550a-e being on.

In an embodiment, each pixel may produce a substantially cylindrically symmetric or substantially radially symmetric actinic radiant intensity spatial distribution that overlaps with those neighboring pixels as illustrated in FIGS. 5C-5F. Thus, the effective intensity at any location on the formable material, is not just the intensity of the radiation from the corresponding individual pixel but a cumulative sum of contributions from neighboring pixels as well. The applicant has found that there is a need to intelligently select the pixels & their intensity (changing duty cycle) on the SLM such that the effective irradiation dose (intensity integrated over an exposure time) at any particular location can be controlled precisely and dimensional control of the curing can be significantly improved.

Figure 6A:
FIG. 6A is an illustration of a map representative of a desired curing region as used in an embodiment.
Figure 6B:
FIG. 6B is an illustration of a map of modulation values as used in an embodiment.
Figure 6C:
FIG. 6C is an illustration of a simulated cured region as used in an embodiment.

FIG. 6A is an illustration of a map representative of a desired curing region 654a. FIG. 6B is an illustration of a map of modulation values 654b that might be used by a SLM 448 assuming the intensity of actinic radiation at the formable material matches the pixels in the spatial light modulator. FIG. 6C is the simulated cured region 654c produced by the map of modulation values 654b. The simulation is over a 30×40 pixel area and the white regions represent cured material and pixels in the "ON" position. The beam is assumed to have a Gaussian profile with a standard deviation of 2 pixels. The simulation results in in FIG. 6C demonstrate significant deviation from map representative of a desired curing region 654a. This is a result of the intensity at any location being a convoluted contribution from the neighboring pixels and a gaussian profile of the intensity distribution of actinic radiation at a plane of formable material.

In an embodiment, the map of modulation values 654b used by the SLM 448 is adjusted so as to have tighter dimensional control over curing the formable material under the template. This tighter dimensional control on the spatial variation of effective dose of actinic radiation on the formable material can help prevent extrusions being formed efficiently in the nanoimprint lithography process. The applicant has found that extrusions form when the formable material spreads to the mesa sidewalls and is also exposed to enough actinic radiation to cause the formable material on the mesa sidewalls to cure.

Method of Optimizing the Map of Modulation Values

An embodiment, may include an optimization process 700 to achieve the near net shape cured region based on an initial model of the process and this process may be further supplemented by a machine learning and/or iterative learning control process that adapts to the process variability (stochasticity) by learning the process over many iterations and progressively improving the curing resolution. This optimization process 700 may be used by the nanoimprint lithography system 400 for extrusion control and any other processes that employs SLM 448 for selective curing of the formable material and/or heating of the substrate and/or template. In an embodiment, the optimization process 700 may be used by the nanoimprint lithography system 400 to actively improve the imprinting process 300 during production and/or tuning of the imprinting process 300.

In an embodiment, the optimization process 700 may take advantage of the de-focused nature of the output of each pixel in combination with the intensity and the temporal modulation capabilities of SLM 448 to produce fine tunable dosage pattern on the formable material. For example, the optimization process 700 may include performing the imprinting process 300 with an initial map of modulation values. The optimization process 700 may also include a measuring step S714 of measuring defects in the imprinted film. The defects may include extrusion defects and/or non-fill defects. These defects may be measured during imprinting, after imprinting but before the next field is imprinted, after all fields on the substrate have been imprinted, or after the substrate has had one more processes performed on it. The locations, types of defects, and the previous map of modulation values are then used by a map generation process S716.

Figure 7A:
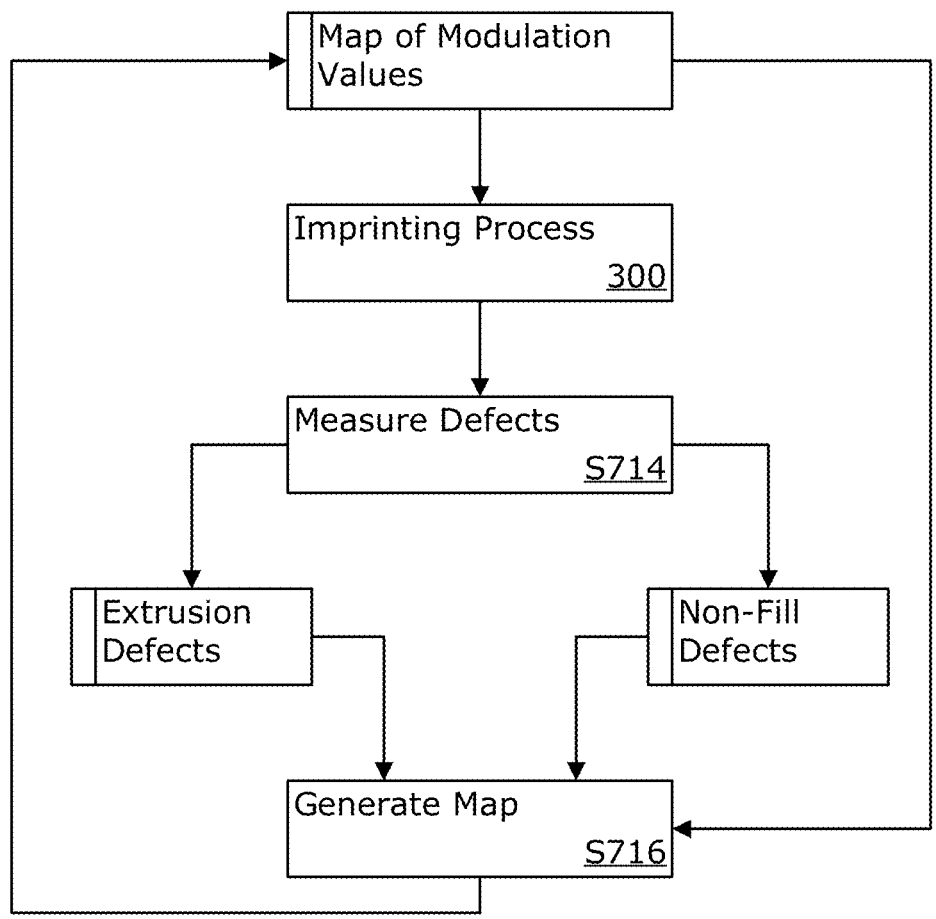
FIG. 7A is a flowchart illustrating an optimization process as used in an embodiment.
Figure 7B:
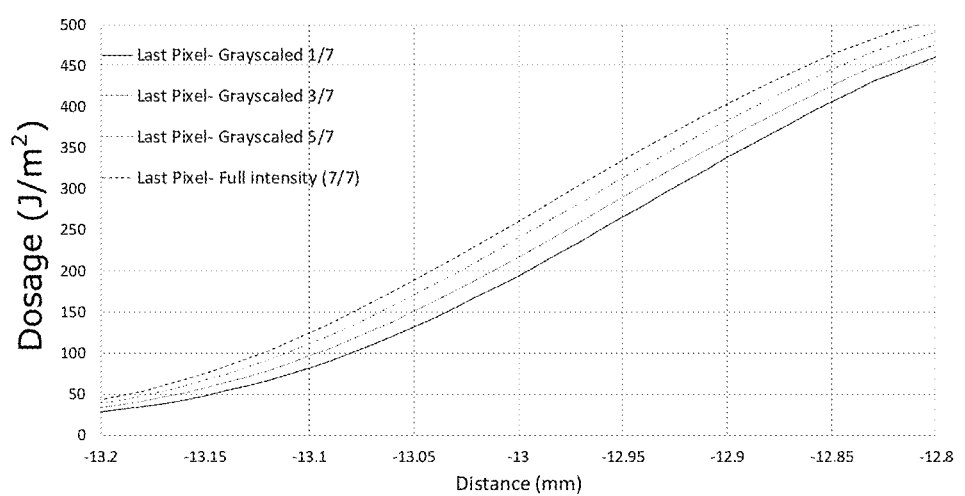
FIG. 7B is an illustration of distribution of dosage changes as relevant to an embodiment.

For example, in the map generation process S716, if there are extrusion defects near a particular pixel, then dosage (J/m$^2$) of UV radiation due to one or more pixels near the extrusion may be decreased (by changing intensity or duty cycle). If the radiant dosage from a pixel is changed to a lower value, then an edge of the cured formable material can be moved in increments smaller than the size projected by each pixel at the plane of the formable material. FIG. 7B is an illustration of how the distribution of the dosage changes as function of changing the amount energy provided by the pixel closest to the edge. The applicant has found that it is possible to adjust the amount of energy that a pixel at an edge of an actinic radiant dosage pattern provides. For example, when the amount of energy is adjusted by one eighth then the edge of the pattern can be moved by roughly ⅛ the of the projected pixel pitch (for example 8 μm) for each adjustment. This can enhance the dimensional resolution without adding any additional components. The incremental shift is dependent upon the number of levels which are available to the combination of software and hardware which control the SLM 448.

In an embodiment, the map of modulation values that can be used by the SLM 448 to generate a desired radiant dosage at the plane of the formable material takes into account that the distribution of the radiant intensity at the plane of the formable material is not a top hat but is instead a smoothly varying function such as a gaussian beam. In which case, radiant dosage at any one point is a convoluted sum of the distribution of the radiant dosage from a single pixel and neighboring pixels. In an embodiment, a set of pixels are selected each providing an adjusted radiant dosage that ensures that the gap between cured and uncured regions is maximized, thus improving the sharpness of edges at the mesa sidewall. The selection of this DMD pattern will be based on an optimization process 700.

In an embodiment, the processor 140 may receive a map C representative of a desired curing region on a portion of the substrate. For example, the map C may represent a rectangle that corresponds to the mesa sidewalls in which each element $C_{i,j}$ of the map C is 1 or 0 ($C_{i,j} \in \mathbb{Z}_2$). In which the indexes i and j represent discretization of the substrate in along the x and y axes.

In an embodiment, the processor 140 may receive radiant intensity information $F_{i,j}$ that represents the spatial distribution of the radiant intensity at the plane of the formable material at a plurality of points (which may be on a grid represented by indexes i and j) on the substrate due to a single pixel of the SLM 448. In an embodiment, there is a set of intensity information F in which each element $F_{k,l,i,j}$ represents intensity information associated with a pixel k,l of the SLM 448 for each region of the substrate represented by the indexes i and j. In an embodiment, the intensity information is represented by a parametrized function. For example, the parameterized function may be a two-dimensional Gaussian function specified by the parameters (x: x position of peak intensity; y: y position of peak intensity; $\sigma_x$: standard deviation of the intensity along an x axis; $\sigma_y$: standard deviation of the intensity along an y axis; G: Peak intensity).

The processor 140 may then determine a map M of modulation values for each pixel in the SLM. Wherein each element $M_{k,l}$ represents a modulation value associated with a pixel k,l of the SLM 448. In which modulation value element $M_{k,l}$ has a value between 0 and 1 $\{M_{k,l} \in \mathbb{R} | 2 \le M_{k,l} \le 1\}$. A modulation value of 0 represents that a minimal amount of radiation incident on an individual pixel is directed towards the formable material and a value of 1 represents that the pixel directs the maximum amount of incident radiation towards the formable material. This may include calculating a set of tentative distribution D' of the radiation dosage (J/m$^2$) in which each element of the set is a tentative distribution $D'_{i,j}$ of the radiation dosage (J/m$^2$) for each region of the substrate represented by the indexes i and j (as used in the map C above) for a tentative map M' as described by equation (1) below.

$$D'_{i,j} = \sum_k \sum_l M'_{k,l} \times F_{k,l,i,j} \qquad (1)$$

In an embodiment, the calculation of each element $F_{k,l,i,j}$ includes the integration of a function $F_{k,l}(x,y)$ (or measurement data) over a region of space represented by the indexes i and j.

The processor 140 may receive a dose threshold δ (J/m$^2$) which is representative of a threshold for curing the formable material. The processor 140 may then use the Heaviside step function along with the dose threshold to determine a tentative curing C' map which would be produced by the tentative distribution D' as described by the equation (2) below.

$$\mathbb{H}(x) = \begin{cases} 0 & x < 0 \\ 1 & x \ge 0 \end{cases} \qquad (2)$$

$$C'_{i,j} = \mathbb{H}(D'_{i,j} - \delta)$$

The processor 140 may then test a variety of tentative maps so as to minimize a criteria function such as equation (3) below.

$$\min_{M'} \sum_i \sum_j |C_{ij} - C'_{ij}| \qquad (3)$$

Equation (4) below is equations (1)-(3) combined together.

$$\min_{M'} \left( \sum_i \sum_j \left| C_{ij} - \text{IH}\left( \sum_k \sum_l M'_{k,l} \times F_{k,l,i,j} - \delta \right) \right| \right) \quad (4)$$

The processor 140 may use equation (4) above to identify a tentative map M' that minimizes the test criteria as described by equation (4) and can be used as the map M of modulation values. In an embodiment, the summation over the indexes k and l is done over the entire set. In an embodiment, the summation of the indexes k and l is done over a subset which is limited by the standard deviation of the pixel intensity distribution $F_{k,l,i,j}$. For example, the summation may be performed only within 3 standard deviations of the peak intensity.

Figure 8A:
FIG. 8A is an illustration of a map representative of a desired curing region as used in an embodiment.
Figure 8B:
FIG. 8B is an illustration of a map of modulation values as used in an embodiment.
Figure 8C:
FIG. 8C is an illustration of a simulated cured region as used in an embodiment.

The results of this process can be seen in FIGS. 8A-C. FIG. 8A is an illustration of a map C (854a) that is representative of a desired curing region. FIG. 8B of the tentative map M' of modulation values (854b) that results in a tentative curing map C' (854c) which is a good match for the desired curing region and can thus be used as the map of modulation values M as illustrated in FIG. 8C. In an embodiment, the map M' of modulation values corresponds to the discretization capacity of the SLM 448.

In alternative embodiment, higher order differences may be used in the minimization function as illustrated in equation (5) in which n is an integer.

$$\min_{M'} \left( \sum_i \sum_j \left( C_{ij} - \text{IH}\left( \sum_k \sum_l M'_{k,l} \times F_{k,l,i,j} - \delta \right) \right)^{2n} \right) \quad (5)$$

In an embodiment, the SLM 448 is a DMD and the map of modulation values M refers to the percent of time relative to the total curing time that a particular pixel is guiding light towards the formable material. In an embodiment, the SLM 448 is a spatio-temporal modulator that is also capable of modulating the intensity as well as the duty cycle in which case both intensity and duty cycle may be modulated and considered within the map of modulation value calculation.

Method of Optimizing the Map of Modulation Values Using Feedback

Figure 9:
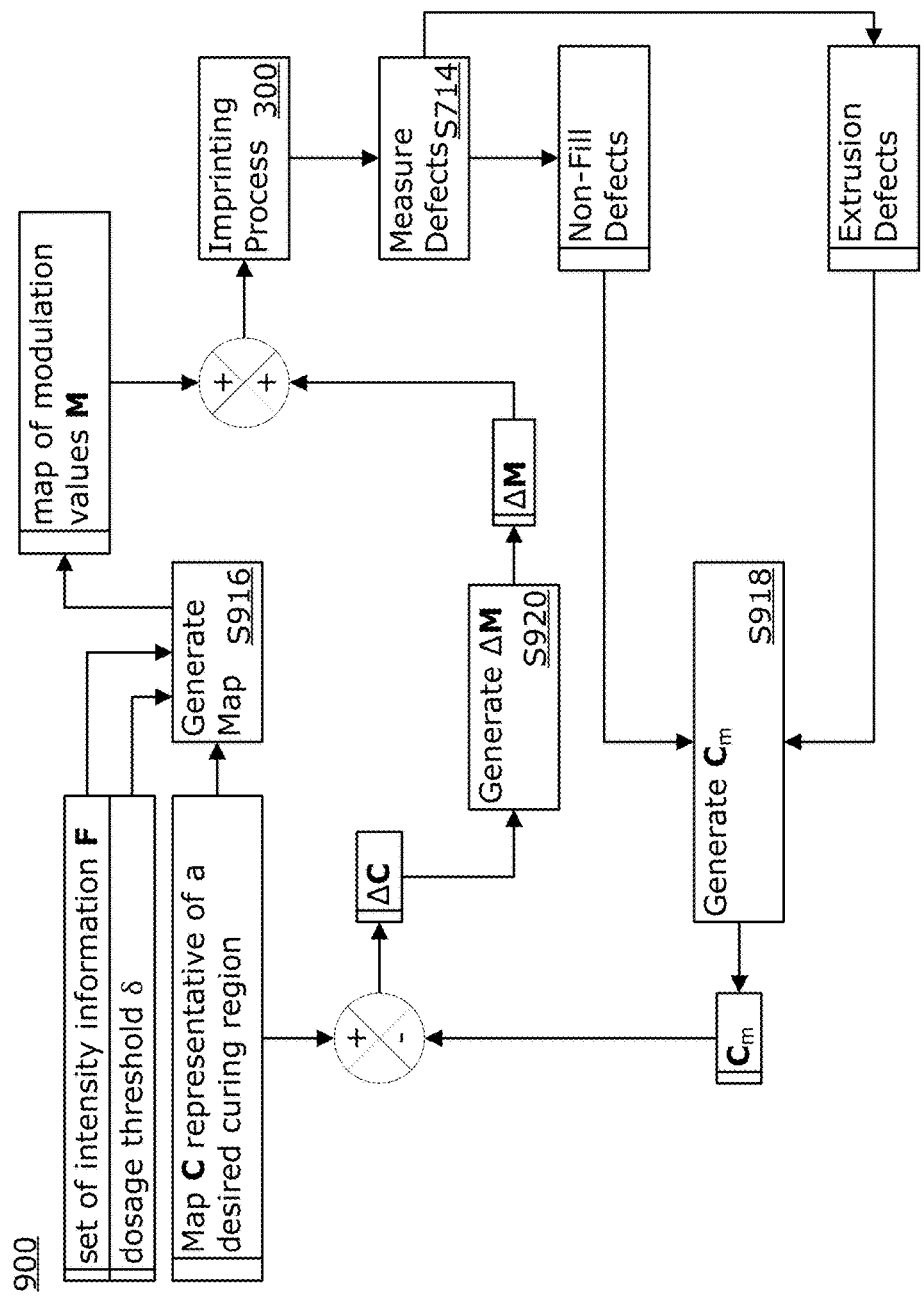
FIG. 9 is a flowchart illustrating an optimization process as used in an embodiment.

FIG. 9 is an illustration of an optimization process 900 as may be used in an embodiment. A processor 140 may receive information such as: a map C representative of a desired curing region; a set of intensity information F; and a dose threshold δ. The processor 140 may use this information in a map generation process S916 as described in equations (1)-(5) above to generate the map of modulation values M. The imprinting process 300 may then use the map of modulation values M in an imprinting process to generate a cured film. The cured film may then be inspected in a measuring step S714 to identify non-fill defects and extrusion defects. Then in a step S918 a measured map $C_m$ may be generated which is then subtracted from map C to generate an error signal ΔC which is then fed into a map modulation value error signal ΔM generator in a step S920 in a process that is substantially similar to map generation process S916 except that the error signal ΔC is used instead of the map C.

In an embodiment, the optimization process can be aided by a machine learning or an iterative learning procedure that learns from the feedback using images of cured regions to improve the agreement between the desired during region and actual cured regions and compensates for any process variability as well. The optimization process 700 or 900 may include a neural network defect recognition tool, a rule based defect recognition or other methods of identifying defects during measuring step S714.

Method of Optimizing the Map of Modulation Values Using Registration Distortion

Figure 10A:
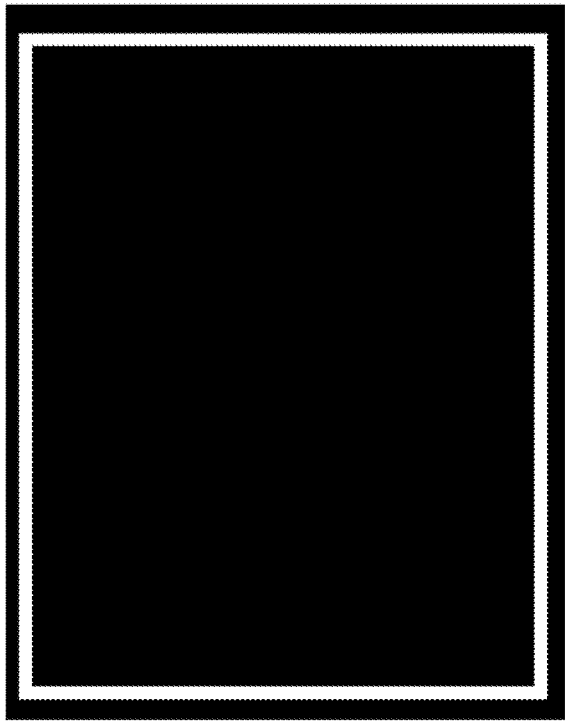
FIGS. 10A-D are illustrations of desired curing regions and actual curing regions.
Figure 10B:
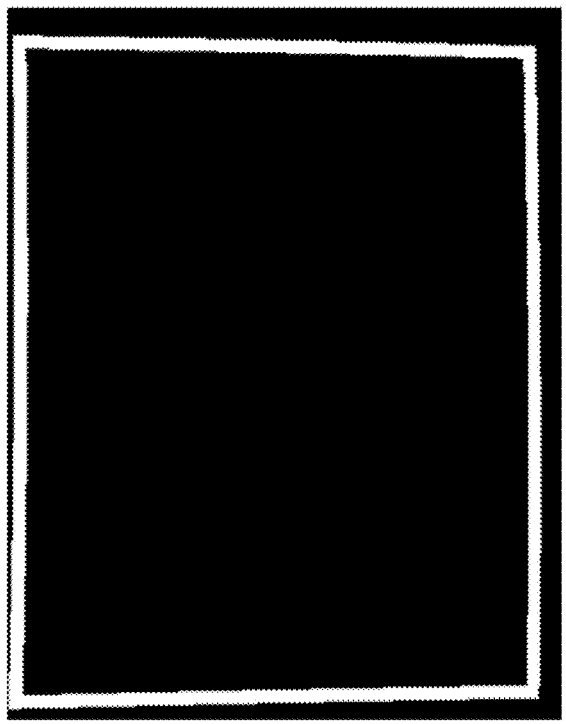

FIG. 10A is an illustration of a map C representative of a desired cured region. FIG. 1013 is an illustration of a measured map $C_m$ in which there is a global distortion issue causing registration errors which may be due to the optical system or other systematic issues. The applicant has determined that these registration errors may be corrected by adjusting the desired cured region to compensate for these registration errors. This adjustment may be done in combination with the optimization process 700 or 900.

The applicant has found that correcting for these shifts and distortions may be accomplished by using an inverse map to adjust the map C representative of a desired cured region. This may be performed periodically to compensate for process drift or may be performed at a calibration stage.

This mapping may be obtained by measuring by obtaining a model function $f$ which maps desired curing positions ($x_d$, $y_d$) to measured curing positions ($x_a$, $y_a$). This mapping may be obtained from one or more experiments in which positions ($x_a$, $y_a$) are measured on a cured film after being exposed with an idealized pattern. Once this mapping is obtained, the inverse of the mapping function ($f^{-1}$) can be used to generate a new map C representative of a desired cured region. Equations (6) below are examples of a model function $f$ which can describe some of the distortions.

$$f = \begin{cases} x_a = x_d(1 + k_1 r^2 + k_2 r^4) + 2p_1 x_d y_d + p_2(r^2 + 2x_d^2) \\ y_a = y_d(1 + k_1 r^2 + k_2 r^4) + 2p_1 x_d y_d + p_1(r^2 + 2y_d^2) \end{cases} \quad (6)$$

Figure 10C:
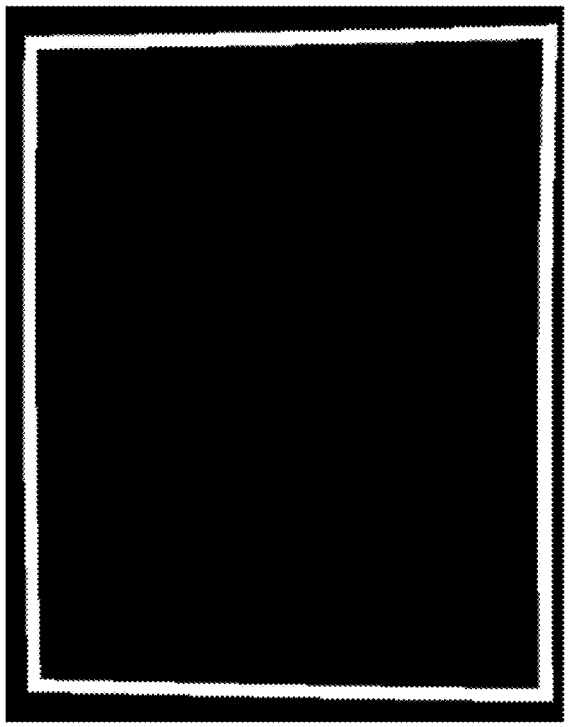
Figure 10D:
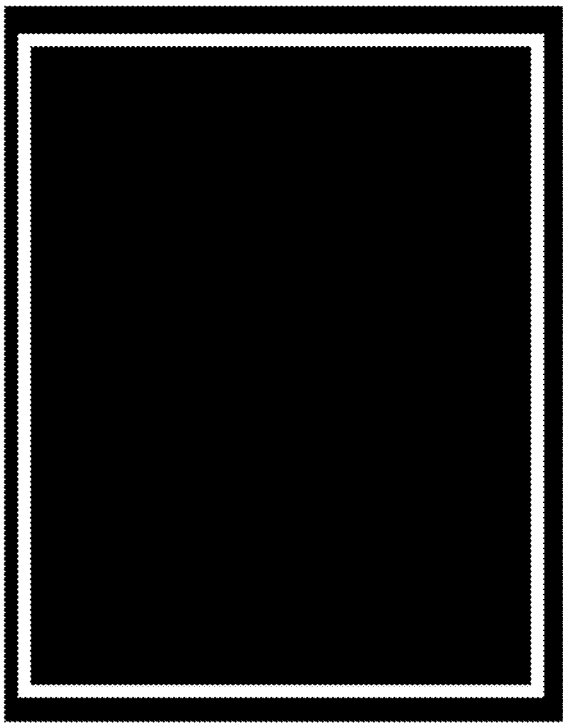

In which r is radial position relative to the center of the optical system, ($k_1$, $k_2$, $p_1$, $p_2$) are fitting coefficients which may be determined based on experiments. This model should account translational shifts shape distortions such as barrel and pin-cushion. This model may be then used to calculate an inverse function $C^{new} = f^{-1}(C)$ as illustrated in FIG. 10C which can then be used to produce a cured region that is pre-compensated for distortions in the system and minimizes the error between desired and actual curing. Other model functions may also be used which map the measured data to the fitted data. The inverse of the model function may be calculated numerically.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:
1. A method comprising:
receiving a map representative of a desired curing region;
receiving, for each pixel of a spatial light modulator,
spatial information representative of an intensity dis- tribution of actinic radiation at a plane of formable material under a template that is guided from the spatial light modulator to the plane of the formable material for curing the formable material under the template;

wherein for each pixel of the spatial light modulator, the spatial information includes a peak position in the plane of the formable material under the template of a peak of the intensity distribution of the actinic radiation at the plane of formable material under the template that is guided from the spatial light modulator to the plane of the formable material for curing the formable material under the template; and generating a map of modulation values for each pixel in the spatial light modulator based on: the spatial information for all of the pixels; and the map representative of the desired curing region.

2. The method as recited in claim 1, further comprising:
sending a first set of signals to the spatial light modulator based on the map of modulation values;
illuminating the spatial light modulator with actinic radiation;
wherein the spatial light modulator illuminates a first portion of the formable material under the template to a first actinic radiant dosage pattern in accordance with the map of modulation values producing a first cured film;
measuring a first set of defects in the first cured film, including both extrusion defects and non-fill defects;
generating a second map of modulation values based on the first set of defects;
sending a second set of signals to the spatial light modulator based on the second map of modulation values; and
wherein the spatial light modulator illuminates a second portion of the formable material under the template to a second actinic radiant dosage pattern in accordance with the second map of modulation values producing a second cured film.

3. The method as recited in claim 2, wherein the spatial light modulator produces the second actinic radiant dosage pattern by changing duty cycles of pixels of the spatial light modulator in accordance with the second map of modulation values.

4. The method as recited in claim 3, wherein:
the spatial light modulator includes a digital micromirror device; and
changing the duty cycle of an individual pixel of the spatial light modulator includes adjusting a period of time during which an individual mirror on the digital micromirror device guides actinic radiation towards the formable material under the template.

5. The method as recited in claim 2, further comprising:
measuring a second set of defects in the second cured films; and
wherein the second set of defects is less than the first set of defects.

6. The method as recited in claim 2, wherein:
the spatial light modulator includes a transmissive spatial intensity modulator; and
the spatial light modulator produces the second actinic radiant dosage pattern by changing transmissivity of pixels of the transmissive spatial intensity modulator in accordance with the second map of modulation values.

7. The method as recited in claim 6, wherein the transmissive spatial intensity modulator includes:
a liquid crystal polarization retarder; and
a polarizer.

8. The method as recited in claim 2, wherein:
the spatial light modulator includes a reflective spatial intensity modulator; and
the spatial light modulator produces the second actinic radiant dosage pattern by changing reflectivity of pixels of the reflective spatial intensity modulator in accordance with the second map of modulation values.

9. The method as recited in claim 8, wherein the reflective spatial intensity modulator includes:
a liquid crystal polarization retarder on silicon with a reflective coating; and
a polarizer.

10. The method as recited in claim 2, wherein the spatial light modulator produces the first actinic radiant dosage pattern by changing duty cycles of pixels of the spatial light modulator in accordance with the map of modulation values.

11. A method as recited in claim 2 for manufacturing articles further comprising:
processing a substrate on which the second cured film is produced so as to manufacture the articles.

12. The method as recited in claim 2, wherein the first actinic radiant dosage pattern has an outer boundary that is defined by a mesa edge of the template.

13. The method as recited in claim 1, further comprising:
receiving spatial information representative of a second distribution of actinic radiant dosage pattern at the plane of the formable material under the template, wherein the actinic radiation in the second distribution of actinic radiant dosage pattern is not guided by the spatial light modulator to the plane of the formable material; and
wherein generating the map of modulation values is also based on the second distribution of actinic radiant dosage pattern.

14. The method as recited in claim 1 wherein the peak position for each pixel includes an offset vector representative of a deviation from a measured position of peak intensity and an expected position of peak intensity.

15. The method as recited in claim 1, further comprising:
receiving template spatial information representative of an outer boundary of a patterning surface of the template; and
generating the map representative of the desired curing region based on the template spatial information.

16. A method comprising:
receiving a preliminary map representative of a desired curing region;
receiving experimental data representative of a measured cured region based on the preliminary map;
determining fitting parameters of a model function between the desired curing region and the measured cured region;
generating a map representative of the desired curing region based on an inverse model function and the fitting parameters;
receiving, for each pixel of a spatial light modulator, spatial information representative of an intensity distribution of actinic radiation at a plane of formable material under a template that is guided from the spatial light modulator to the plane of the formable material for curing the formable material under the template; and
generating a map of modulation values for each pixel in the spatial light modulator based on: the spatial information for all of the pixels; and the map representative of the desired curing region.

17. A system comprising:

a memory; and a processor configured to:

receive a map representative of a desired curing region;

receive, for each pixel of a spatial light modulator, spatial information representative of an intensity distribution of actinic radiation at a plane of formable material under a template that is guided from the spatial light modulator to the plane of the formable material for curing the formable material under the template;

wherein for each pixel of the spatial light modulator, the spatial information includes a peak position in the plane of the formable material under the template of a peak of the intensity distribution of the actinic radiation at the plane of formable material under the template that is guided from the spatial light modulator to the plane of the formable material for curing the formable material under the template; and generate a map of modulation values for each pixel in the spatial light modulator based on: the spatial information for all of the pixels; and the map representative of the desired curing region.

18. The system as recited in claim 17, further comprising:

a nanoimprint lithography system including:

the spatial light modulator;

a source of actinic radiation configured to illuminate spatial light modulator;

a template chuck configured to hold the template;

the processor configured to:

send a first set of signals to the spatial light modulator based on the map of modulation values;

wherein the spatial light modulator illuminates a first portion of the formable material under the template to a first actinic radiant dosage pattern in accordance with the map of modulation values producing a first cured film;

receive defect measurements of a first set of defects in the first cured film, including both extrusion defects and non-fill defects;

generate a second map of modulation values based on the first set of defects;

send a second set of signals to the spatial light modulator based on the second map of modulation values; and wherein the spatial light modulator illuminates a second portion of the formable material under the template to a second actinic radiant dosage pattern in accordance with the second map of modulation values producing a second cured film.

* * * * *